(12) United States Patent
Ruben et al.

(10) Patent No.: US 7,682,878 B2
(45) Date of Patent: Mar. 23, 2010

(54) ENCAPSULATION CIRCUITRY ON A SUBSTRATE

(75) Inventors: David A. Ruben, Mesa, AZ (US); Scott B. Sleeper, Phoenix, AZ (US); Peter C. Tortorici, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 11/877,408

(22) Filed: Oct. 23, 2007

(65) Prior Publication Data

US 2008/0038878 A1   Feb. 14, 2008

Related U.S. Application Data

(62) Division of application No. 11/042,740, filed on Jan. 25, 2005, now Pat. No. 7,288,847.

(51) Int. Cl.
  *H01L 21/44* (2006.01)
(52) U.S. Cl. .................. 438/124; 438/112; 438/123; 438/127; 257/666; 257/676; 257/774; 257/791; 257/E23.066; 257/E23.092
(58) Field of Classification Search ............. 438/112, 438/123, 124, 127; 257/666, 676, 774, 791, 257/E23.066, E23.92
  See application file for complete search history.

(56) References Cited

U.S. PATENT DOCUMENTS

| 4,933,808 | A |   | 6/1990  | Horton |         |
|-----------|---|---|---------|--------|---------|
| 5,016,138 | A | * | 5/1991  | Woodman | ......... 361/688 |
| 5,096,762 | A | * | 3/1992  | Yoshida et al. | ......... 428/76 |
| 5,250,843 | A |   | 10/1993 | Eichelberger |  |
| 5,661,339 | A | * | 8/1997  | Clayton | ......... 257/678 |
| 5,677,830 | A |   | 10/1997 | Nogas |  |
| 5,700,981 | A |   | 12/1997 | Tuttle |  |
| 5,831,369 | A |   | 11/1998 | Furbacher |  |
| 5,876,498 | A | * | 3/1999  | Thompson, Sr. | ......... 118/64 |
| 5,895,222 | A |   | 4/1999  | Moden |  |
| 5,973,263 | A |   | 10/1999 | Tuttle |  |
| 6,057,175 | A |   | 5/2000  | Milla |  |
| 6,164,636 | A | * | 12/2000 | Taylor | ......... 269/287 |
| 6,232,659 | B1 | * | 5/2001  | Clayton | ......... 257/724 |
| 6,372,551 | B1 | * | 4/2002  | Huang | ......... 438/124 |
| 6,378,857 | B1 |   | 4/2002  | Taylor |  |
| 6,400,033 | B1 | * | 6/2002  | Darveaux | ......... 257/778 |
| 6,541,874 | B2 |   | 4/2003  | Nguyen |  |
| 6,717,259 | B2 | * | 4/2004  | Reeder et al. | ......... 257/724 |
| 6,875,367 | B2 | * | 4/2005  | Hsieh et al. | ......... 252/62.51 R |
| 6,875,631 | B2 |   | 4/2005  | Nishizawa |  |

FOREIGN PATENT DOCUMENTS

EP        0 382 621 B1    5/1998

* cited by examiner

*Primary Examiner*—Andy Huynh
(74) *Attorney, Agent, or Firm*—Carol F. Barry

(57) ABSTRACT

An assembly for a circuit board includes a substrate, at least one circuit component formed on the substrate, and a frame. The frame comprises a first substantially planar surface attached to the substrate, and a hole formed through the frame and defined by a wall that surrounds the at least one circuit component. A method of manufacturing the circuit board includes the step of attaching the substantially planar surface of the frame to the substrate in an arrangement in which the at least one circuit component is surrounded by a wall that defines the hole.

10 Claims, 4 Drawing Sheets

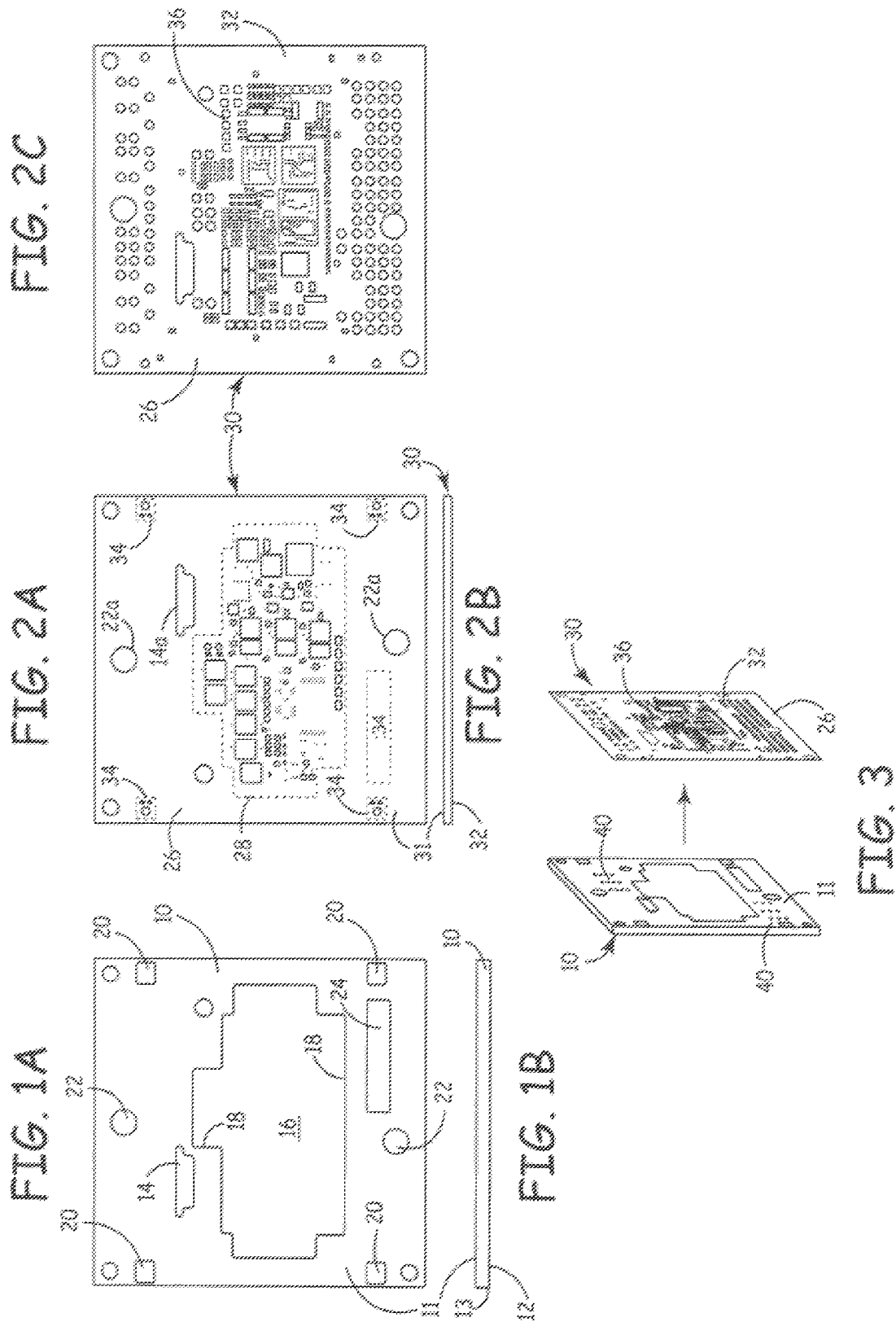

ENCAPSULATION CIRCUITRY ON A SUBSTRATE

CROSS REFERENCE TO PRIORITY APPLICATION

This application is a divisional of U.S. application Ser. No. 11/042,740, filed Jan. 25, 2005, now U.S. Pat. No. 7,288,947 which is incorporated by reference herein.

TECHNICAL FIELD

The present invention generally relates to embodiments for circuitry manufacturing processes, and more particularly relates to methods and devices for encapsulating or otherwise protecting and insulating circuitry.

BACKGROUND

During manufacture of a circuit board, electronic components and their interconnections are etched, imprinted, or otherwise attached to a substrate. The substrate and the electronic components are subsequently subjected to various processing steps. One particular processing step includes covering the circuit components and the underlying substrate with a sheet of silicone or other material that provides environmental and electrical protection.

Transfer molding is one process by which a protective material is applied over a circuit component. Another common process includes encapsulating the circuitry with silicone or another suitable material. The protective material is applied to the substrate as a liquid and then cured or otherwise hardened to form a solid coating. Although silicone and other suitable materials provide environmental, electrical, and mechanical protection to the encapsulated circuitry, there are some inherent difficulties and inefficiencies with commonly practiced encapsulation methods. For example, it can be difficult to supply a protective material that has sufficient fluidity to cover and infiltrate the circuitry, and at the same time has sufficient viscosity to set in the area immediately above and around the circuitry without spreading about the surrounding substrate.

One procedure that is aimed toward avoiding the difficulties of optimizing the consistency of an encapsulating material includes assembling a wall around the circuitry that is to be encapsulated. The wall is thin and rigid, and is shaped to surround the circuitry and to thereby barricade the encapsulating material. A few integral posts extend below the wall. When the circuit board is manufactured, the posts are press fitted into holes that are punched into the substrate around the circuit components that are to be encapsulated.

Although providing a wall around the circuit components is a beneficial step, there are some difficulties during and following the encapsulating process. For example, the assembly can be prone to leak around the punched post holes and at the interface between the substrate and the wall. The wall is also a cast molded structure, and cast molding individual walls can be a relatively expensive process. The wall can also impede some cost-efficient ways to apply the encapsulating material, such as a printing technique and the use of a squeegee. Further, subsequent substrate processing can be impeded by the wall's presence, particularly if the substrate is flexible. Additional electronic assemblies are sometimes combined with circuit components that remain exposed after the encapsulation procedure. The wall, or even a slightly warped substrate, can make it somewhat difficult to match some of the intricate electrical contacts between the additional electronic assemblies and the exposed circuit components.

Accordingly, it is desirable to provide a manufacturing process and apparatus that alleviates the difficulties associated with encapsulating an integrated circuit and any associated passive components on a substrate. In addition, it is desirable to provide a process and apparatus that does not impede subsequent substrate processing or electrical connections. Furthermore, other desirable features and characteristics of the present invention will become apparent from the subsequent detailed description and the appended claims, taken in conjunction with the accompanying drawings and the foregoing technical field and background.

BRIEF SUMMARY

An assembly for a circuit board is provided. The assembly includes a substrate, at least one circuit component formed on the substrate, and a frame. The frame includes a first substantially planar surface attached to the substrate, and a hole that is formed through the frame and defined by a wall that surrounds the integrated circuit.

A method of manufacturing the circuit board assembly is also provided. The method includes the step of attaching the substantially planar surface of the frame to the substrate in an arrangement in which the circuitry is surrounded by a wall that defines the hole.

An apparatus for use on a substrate that supports at least one circuit component is also provided. The apparatus includes a frame having a first substantially planar surface, and a wall that defines a hole that is formed through the frame and sized to surround the at least one circuit component when the frame is combined with the substrate by attaching the first substantially planar surface thereto.

BRIEF DESCRIPTION OF THE DRAWINGS

The present invention will hereinafter be described in conjunction with the following drawing figures, wherein like numerals denote like elements, and FIG. 1A is a bottom view of a substantially planar frame that includes a well that is sized to surround at least one circuit component and contain an encapsulating material according to an embodiment of the invention, and FIG. 1B is a side view of the frame;

FIG. 2A is a top view of a circuit board, FIG. 2B is a side view of the board, and FIG. 2C is a bottom view of the board;

FIG. 3 is an exploded view of an assembly that includes the substantially planar frame and the circuit board according to an embodiment of the invention;

DETAILED DESCRIPTION

Figure 4:
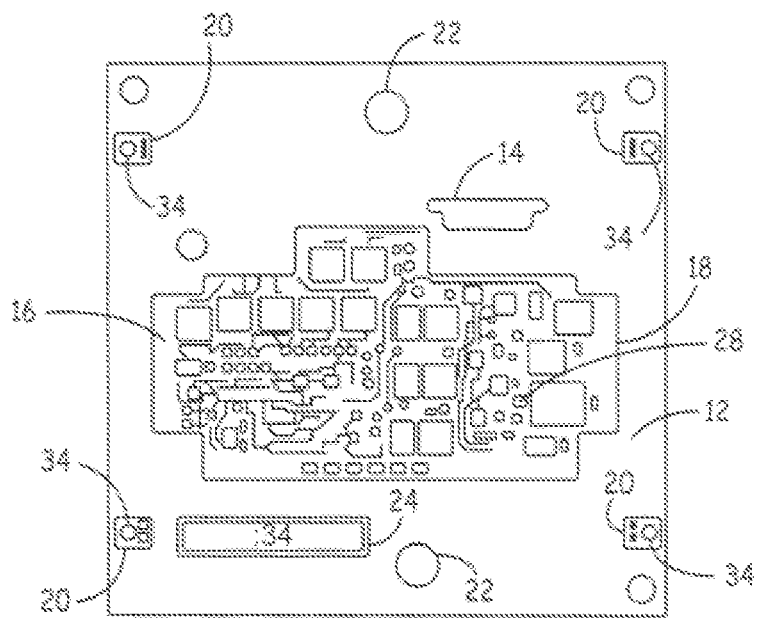
FIG. 4 is a top view of an assembled frame and circuit board according to an embodiment of the invention, illustrating some components of the planar board top surface being exposed through various holes in the frame.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The present invention includes an assembly that alleviates some difficulties associated with encapsulating circuitry on a substrate, and does not impede subsequent substrate processing or electrical connections. The assembly includes a substantially planar frame 10, bottom and side views of which are respectively illustrated in FIGS. 1A and 1B. The frame 10 includes a well 16 that is defined by a continuous wall 18. The well 16 is a hole that extends through the frame 10 from the top surface 11 to the bottom surface 12 in order to expose some of the circuit components when the frame 10 is attached to a substrate, and to contain an encapsulating material as will subsequently be described in detail. In the embodiment illustrated in FIG. 1 additional holes 14, 20, 22, 24 are included in the frame 10 to provide visibility or access to the substrate that supports the circuitry. The additional holes 14, 20, 22, 24 will likewise subsequently be described in detail.

FIGS. 2A and 2C respectively illustrate the top surface 31 and bottom surface 32 of a circuit board 30, and FIG. 2B illustrates a side view thereof. The circuit board 30 includes a substrate 26 with circuit components 28 formed thereon. In the illustrated embodiment, an identification code 34 is printed or otherwise provided on the board top surface 31. Also, the board top surface 31 and bottom surface 32 have electrical contacts 34, 36 exposed thereon.

Having described the circuit board 30 and the frame 10, the relationship between the two will be described next with reference to FIG. 3. The frame 10 overlies at least a portion of the circuit board 30 with the frame bottom side 11 attached to the board top surface 31. In the embodiment illustrated in FIG. 3, an adhesive material 40 is employed to join the board 30 and the frame 10. Although only a few areas on the frame bottom surface 11 are covered with adhesive material 40 in the illustrated embodiment, the entire bottom surface 11 can be covered with the adhesive material 40. Exemplary adhesive materials include thermosetting resins such as epoxy compounds, thermoplastics such as polyetherimide, and pressure-sensitive adhesives such as acrylic-based compounds. Pressure-sensitive adhesives typically have a tacky texture due to their semi-hardened state. In an exemplary embodiment a pressure-sensitive adhesive is applied to the frame bottom surface 11, and then covered with paper or another material to protect the adhesive from contamination before the frame 10 is adhered to the board 30.

Returning to FIGS. 1B and 2B, it is seen that the frame bottom surface 11 is substantially planar, and is consequently suited to be adhered to the substantially planar board top surface 31 using the adhesive material 40. An exemplary frame 10 is a rigid body formed from a plurality of laminated planar sheets, although numerous other materials and manufacturing methods can provide the frame with at least the planar bottom surface 11 that can be well adhered to the planar board top surface 31.

In an exemplary embodiment the frame 10 is formed from a material that is identical to that of the circuit board substrate 26, or that has a coefficient of thermal expansion (CTE) that matches or approximates that of the circuit board substrate 26. For example, common materials for the circuit board substrate 26 include glass-reinforced epoxies such as bismaleimide triazine (BT) epoxy. Exemplary frame materials that provide dimensional stability between such a circuit board 30 and the frame 10 include BT epoxy, other similar glass-reinforced epoxies, and further materials that have a CTE that matches or approximates that of BT epoxy.

FIG. 4 illustrates a top view of the assembled frame 10 and circuit board 30, with some components of the planar board top surface 31 being exposed through various holes in the frame 10. For instance, electrical contacts 34 on the circuit board 30 are accessible through the holes 20 in the frame 10. Also, the board identification code 34 is visible through another hole 24 in the frame 10. Additional frame and board hole pairs 14-14a, and 22-22a are arranged to align the frame 10 and the board 30, or to provide access through the board 30 and frame 10 for purposes such as tooling.

Figure 5:
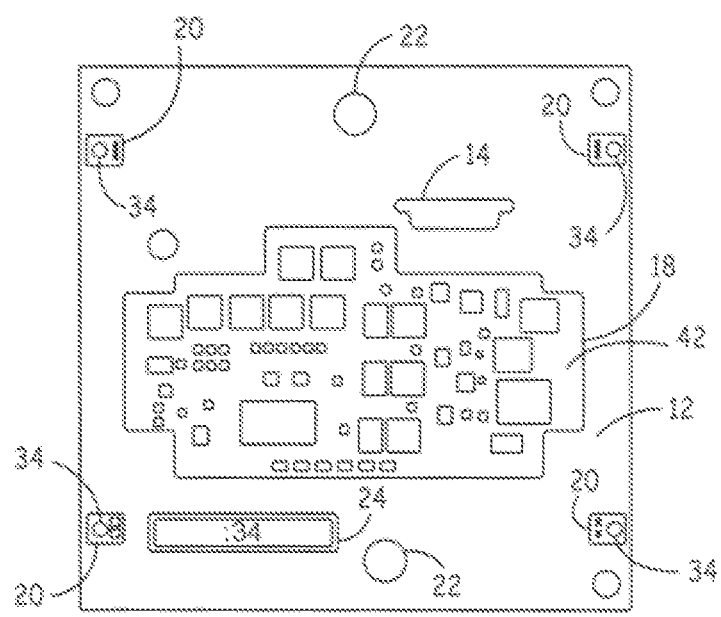
FIG. 5 is a top view of an assembled frame and circuit board according to an embodiment of the invention, after supplying an encapsulating material to a well in the frame.

As previously mentioned, the well 16 extends through the frame 10 to expose the circuit components 28. After the frame 10 is adhered to the circuit board 30, an encapsulating material is deposited into the well 16 and held therein by the surrounding wall 18 that defines the well 16. FIG. 5 depicts the encapsulating material 42 after being deposited into the well 16. Exemplary encapsulating materials include silicone and epoxy compounds, although there are numerous other materials that can likewise provide electrical, mechanical, and environmental protection for the circuit components 28.

Figure 6:
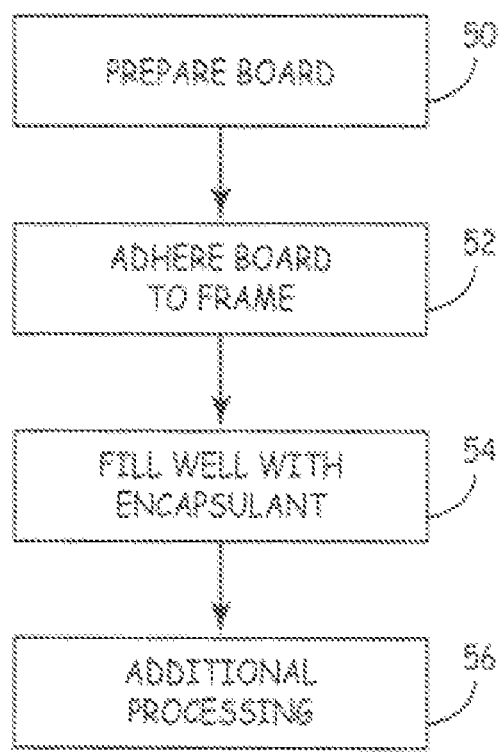
FIG. 6 is a flow chart that represents a method of manufacturing the frame and circuit board assembly according to an embodiment of the invention.

Having described the frame and circuit board assembly according to several embodiments, a method of manufacturing the assembly will next be described with reference to FIG. 6. Beginning with step 50, the circuit board 30 is cleaned and otherwise prepared. In an exemplary embodiment, preparing the substrate 26 includes adding the substrate-level circuitry to the substrate, including the circuit components 28. In another embodiment, the substrate-level circuitry, including the circuit components 28 are added to the substrate after attaching the frame 10. The substrate-level circuitry can be included using any known method or combined methods including etching, printing, photolithography, soldering, wire bonding, and so forth.

The substantially planar frame 10 is attached to the circuit board 30 as step 52. As mentioned previously, one of the planar surfaces of the frame is attached to one of the board surfaces in one embodiment although it is clearly within the scope of the invention to attach one or more frames on one or more board surfaces as necessary to accommodate the manner in which the substrate-level circuitry is arranged on the circuit board substrate 26. In the event that circuitry on both sides of the substrate 26 is exposed and should be protected using an encapsulating material, two frames can be attached to opposite board surfaces. An exemplary assembly includes a frame and a circuit board substrate that have approximately the same peripheral dimensions. Another exemplary assembly includes a plurality of frames on a substrate that has an array of circuit components formed thereon, with each frame providing a well around respective circuit components.

In the embodiment depicted in FIGS. 1 to 3, the circuit board 30 and the frame 10 are each square-shaped members with approximately matching side lengths. Such shapes and sizes are in no way limiting, but illustrate some of the advantages of combining a board and a frame that have approximately the same peripheral dimensions. The large planar frame 10 provides a rigid and stable support for the circuit board 30 and thereby keeps the board 30 from bending and alleviates any difficulties that may otherwise be associated with subsequent processing.

An adhesive material is employed to attach the board 10 and the frame 30 in an exemplary joining step. As mentioned previously, in an exemplary embodiment the adhesive material is supplied first to the frame surface that is to be attached to the circuit board 30. Only a few areas of the frame surface can be covered with adhesive material, or the entire frame surface can be covered with the adhesive material. In another embodiment, the adhesive material is applied to the circuit board 30 before the circuit board 30 is attached to the frame 10. Exemplary adhesive materials include acrylic-based compounds and epoxy compounds. Other known methods and devices can also be used to join the board and the frame 30.

After the circuit board 30 and the frame 10 are attached, the encapsulating material 42 is supplied to the well 16 as step 54. The wall 18 that defines the well 16 provides a barricade that prevents the encapsulating material 42 from leaking above or below the frame 10. The encapsulating material covers and surrounds the circuit components 28 on the substrate 26, and then hardens to provide electrical, environmental, and mechanical protection to the circuit components 28.

Finally, any further processing to the circuit board 30 is performed as step 56. Additional processing can include repeating steps 52 and 54 by attaching a second frame to the opposite circuit board surface or to another uncovered area of the circuit board, and then providing protection to other circuit components by supplying an encapsulating material into the frame well. Likewise, additional frames and circuit boards can be combined as needed to form various electrical or electromechanical assemblies including single integrated circuits, multiple integrated circuits in stacked or coplanar arrangements, electronic assemblies that include one or more integrated circuits, single device semiconductors such as diodes and transistors, and passive electrical components such as resistors and capacitors. Additional processing can also include soldering steps, electrical testing, burn-in, environmental testing, screening, and mounting other electronic assemblies to the circuit board.

The frame 10 aids in all of these additional processing steps by providing a rigid and planar support for the circuit board 30. The rigid and flat frame 10 enables the use of thin circuit board substrates, which affects the overall product size and substantially eliminates some of the specialized assembly tooling that would otherwise be necessary to process a flexible circuit board substrate. The combined frame and board assembly alleviates many of the difficulties associated with encapsulating circuit components on a substrate, and does not impede subsequent substrate processing or electrical connections.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of manufacturing a circuit board assembly comprising:

providing a substrate having a top surface with a circuit component region adapted to mount a component having a height dimension that extends above the substrate top surface, providing a substantially planar frame having a substantially planar bottom side surface and a substantially planar top side surface, the frame having a thickness, the frame further having a continuous wall that defines a hole formed through the thickness of the frame, the continuous wall extending from the top surface to the bottom surface through the thickness of the frame, stacking the frame and the substrate on top of one another such that the hole in the frame surrounds the circuit component, attaching the substantially planar bottom side surface of the frame to the top surface of the substrate, the frame being of a thickness, such that upon stacking the frame and the substrate, the hole forms a well having a depth that is equal to or greater than a height dimension of a component mounted to the substrate top surface, and filling the well formed by the hole with a protective material to encapsulate a component mounted to the substrate top surface.

2. The method of claim 1, further comprising mounting at least one circuit component to be supported by the substrate in the circuit component region before stacking and attaching the substantially planar surface of the frame to the substrate.

3. The method of claim 1, further comprising:

mounting at least one circuit component in the circuit component region after attaching the substantially planar surface of the frame to the substrate.

4. The method of claim 1, wherein the frame further comprises means for providing visibility to the substrate including at least one additional hole formed through the frame that is positioned to overlay the substrate.

5. The method of claim 1, wherein the substrate further comprises at least one hole formed through the substrate, and the frame comprises an additional hole formed through the frame, and the substrate is attached to the frame in an arrangement in which the hole in the substrate is aligned with the additional hole in the frame.

6. The method of claim 1, wherein the substrate is formed from a first material, and the frame is formed of a second material, the first and second materials having approximately the same coefficient of thermal expansion.

7. The method of claim 6, wherein the substrate and the frame are formed from the same material.

8. The method of claim 1, wherein the frame is adhered to the substrate.

9. The method of claim 1, wherein the substrate and the frame have approximately matching peripheral dimensions.

10. The method of claim 1, wherein the substrate further comprises an array of additional circuit component regions, and the assembly further comprises at least one additional frame, each additional frame comprising a substantially planar surface and a wall that defines a hole formed through the frame, the method further comprising the step of:

attaching the substantially planar surface of each additional frame to the substrate in an arrangement in which the each of the holes surrounds a circuit component region in the array.

* * * * *